(12) United States Patent
Nakamura

(10) Patent No.: US 9,214,162 B2
(45) Date of Patent: Dec. 15, 2015

(54) AUDIO-SIGNAL CORRECTION APPARATUS, AUDIO-SIGNAL CORRECTION METHOD AND AUDIO-SIGNAL CORRECTION PROGRAM

(75) Inventor: Masami Nakamura, Hachiouji (JP)

(73) Assignee: JVC KENWOOD Corporation, Kanagawa-Ku, Yokohama-Shi, Kanagawa-Ken (JP)

( * ) Notice: Subject to any disclaimer, the term of this patent is extended or adjusted under 35 U.S.C. 154(b) by 854 days.

(21) Appl. No.: 13/410,411

(22) Filed: Mar. 2, 2012

(65) Prior Publication Data
US 2012/0226372 A1    Sep. 6, 2012

(30) Foreign Application Priority Data
Mar. 4, 2011   (JP) .................. 2011-048382

(51) Int. Cl.
*G06F 17/00*   (2006.01)
*G10L 21/0332* (2013.01)
*H03G 7/00*    (2006.01)
*H03G 3/00*    (2006.01)
*H03G 11/00*   (2006.01)

(52) U.S. Cl.
CPC ............ *G10L 21/0332* (2013.01); *G06F 17/00* (2013.01); *H03G 3/002* (2013.01); *H03G 7/007* (2013.01); *H03G 11/008* (2013.01)

(58) Field of Classification Search
CPC . G06F 17/00; G10L 21/0208; G10L 21/0332; H03F 1/32; H03G 3/002; H03G 3/3089; H03G 3/32; H03G 7/007; H03G 9/005; H03G 11/008; H04B 1/0475; H04B 1/123; H04B 15/00; H04R 3/00; H04R 25/356; H04R 25/505; H04R 2430/01

USPC .......... 375/345; 381/56, 94.1, 104, 106, 107; 455/63.1, 127.2, 232.1, 234.1; 700/94; 704/219, 22, 226, 500, E19.001
See application file for complete search history.

(56) References Cited

U.S. PATENT DOCUMENTS

| | | | | |
|---|---|---|---|---|
| 6,476,745 | B1 * | 11/2002 | Evans et al. .................... | 341/139 |
| 7,590,251 | B2 * | 9/2009 | Andersen et al. ............. | 381/106 |
| 8,428,277 | B1 * | 4/2013 | Skoglund et al. ............. | 381/104 |
| 8,862,257 | B2 * | 10/2014 | Zhang ............................. | 700/94 |
| 2011/0255712 | A1 * | 10/2011 | Urata ............................. | 381/107 |
| 2012/0158410 | A1 * | 6/2012 | Lundback et al. ............. | 704/500 |

FOREIGN PATENT DOCUMENTS

| | | | | |
|---|---|---|---|---|
| JP | 2001-110143 | | 4/2001 | |
| WO | WO 2010149053 | A1 * | 12/2010 | .............. H04L 25/03 |

\* cited by examiner

*Primary Examiner* — Alexander Eljaiek
(74) *Attorney, Agent, or Firm* — Renner, Kenner, Greive, Bobak, Taylor & Weber

(57) ABSTRACT

Sequential digital audio signals are received to calculate a difference between each currently sampled digital audio signal and another digital audio signal sampled at one sampling period before each currently sampled digital audio signal. Differences for the sequential digital audio signals are stored. The number of digital audio signals consecutively clipped is counted in the received sequential digital audio signals. A specific difference is retrieved, from the stored differences, for a digital audio signal sampled at a specific number of sampling periods before each clipped digital audio signal. The specific number of sampling periods is determined based on the counted number of digital audio signals consecutively clipped. Each clipped digital audio signal is corrected based on the specific difference.

9 Claims, 9 Drawing Sheets

| t | L | INPUT (PRE-PROCESSED) DATA S(t) | DIFFERENCE x(t) | CORRECTION VALUE Y(t) | OUTPUT (POST-PROCESSED) DATA O(t) |
|---|---|---|---|---|---|
| ⋮ | ⋮ | ⋮ | ⋮ | ⋮ | ⋮ |
| 0 |  | -0.6308 |  | 0 | -0.6308 |
| 1 |  | -0.61389 | -0.01691 | 0 | -0.61389 |
| 2 |  | -0.60324 | -0.01065 | 0 | -0.60324 |
| 3 |  | -0.66104 | +0.0578 | 0 | -0.66104 |
| 4 |  | -0.77441 | +0.113373 | 0 | -0.77441 |
| 5 |  | -0.78934 | +0.01493 | 0 | -0.78934 |
| 6 |  | -0.81604 | +0.02670 | 0 | -0.81604 |
| 7 |  | -0.88229 | +0.06625 | 0 | -0.88229 |
| 8 |  | -0.8717 | -0.01059 | 0 | -0.8717 |
| 9 |  | -0.92859 | +0.05689 | 0 | -0.92859 |
| 10 |  | -0.97238 | +0.04379 | 0 | -0.97238 |
| 11 |  | -0.81775 | -0.15463 | 0 | -0.81775 |
| 12 |  | -0.78076 | -0.03699 | 0 | -0.78076 |
| 13 |  | -0.94714 | +0.16638 | 0 | -0.94714 |
| 14 |  | -0.9762 | +0.02906 | 0 | -0.9762 |
| 15 |  | -0.91037 | -0.06583 | 0 | -0.91037 |
| 16 |  | -0.92429 | +0.01392 | 0 | -0.92429 |
| 17 |  | -0.95648 | +0.03219 | 0 | -0.95648 |
| 18 |  | -0.98721 | +0.03073 | 0 | -0.98721 |
| 19 |  | -0.99759 | +0.01038 | 0 | -0.99759 |
| 20 |  | -0.97876 | -0.01883 | 0 | -0.97876 |
| 21 |  | -0.99329 | +0.01453 | 0 | -0.99329 |
| 22 |  | -1 | +0.00671 | 0 | -1 |
| 23 |  | -0.98016 | -0.01984 | 0 | -0.98016 |
| 24 |  | -0.97049 | -0.00967 | 0 | -0.97049 |
| 25 |  | -0.96579 | -0.0047 | 0 | -0.96579 |
| 26 | 1 | -1 | +0.03421 | -0.01691 | -1.01691 |
| 27 | 2 | -1 | 0 | -0.01065 | -1.01065 |
| 28 | 3 | -1 | 0 | +0.0578 | -0.9422 |
| 29 | 4 | -1 | 0 | +0.11337 | -0.88663 |
| 30 | 5 | -1 | 0 | +0.01493 | -0.98507 |
| 31 | 6 | -1 | 0 | +0.02670 | -0.9733 |
| 32 | 7 | -1 | 0 | +0.06625 | -0.93375 |
| 33 | 8 | -1 | 0 | -0.01059 | -1.01059 |
| 34 | 9 | -1 | 0 | +0.05689 | -0.94311 |
| 35 | 10 | -1 | 0 | +0.04379 | -0.95621 |
| 36 | 11 | -1 | 0 | -0.15463 | -1.15463 |
| 37 | 12 | -1 | 0 | -0.03699 | -1.03699 |
| 38 | 13 | -1 | 0 | +0.16638 | -0.83362 |
| 39 | 14 | -1 | 0 | +0.02906 | -0.97094 |
| 40 | 15 | -1 | 0 | -0.06583 | -1.06583 |
| 41 | 16 | -1 | 0 | +0.01392 | -0.98608 |
| 42 | 17 | -1 | 0 | +0.03219 | -0.96781 |
| 43 | 18 | -1 | 0 | +0.03073 | -0.96927 |
| 44 | 19 | -1 | 0 | +0.01038 | -0.98962 |
| 45 | 20 | -1 | 0 | -0.01883 | -1.01883 |
| 46 | 21 | -1 | 0 | +0.01453 | -0.98547 |
| 47 | 22 | -1 | 0 | +0.00671 | -0.99329 |
| 48 | 23 | -1 | 0 | -0.01984 | -1.01984 |
| 49 | 24 | -1 | 0 | -0.00967 | -1.00967 |
| 50 | 25 | -1 | 0 | -0.0047 | -1.0047 |
| 51 |  | -0.90768 | -0.09232 | 0 | -0.90768 |
| 52 |  | -0.89731 | -0.01078 | 0 | -0.89731 |
| 53 |  | -0.95016 | +0.05285 | 0 | -0.95016 |

Rows 0–25: NOT PROCESSED
Rows 26–50: PROCESSED q=25
Rows 51–53: NOT PROCESSED

FIG. 4

AUDIO-SIGNAL CORRECTION APPARATUS, AUDIO-SIGNAL CORRECTION METHOD AND AUDIO-SIGNAL CORRECTION PROGRAM

CROSS-REFERENCE TO RELATED APPLICATIONS

This application is based on and claims the benefit of priority from the prior Japanese Patent Application No. 2011-048382 filed on Mar. 4, 2011, the entire content of which is incorporated herein by reference.

BACKGROUND OF THE INVENTION

The present invention relates to an audio-signal correction apparatus, an audio-signal correction method and an audio-signal correction program for improving a clipped audio signal waveform.

It is required for an audio reproduction apparatus to give listeners the feeling of being at a live performance and full impact of the live performance when reproducing music especially pop, which is achieved by raising the sound level of reproduced music, as already known.

However, there is the maximum for the magnitude of reproducible sound level while music is being recorded in storage media such as CDs and DVDs. This is because, for storage media such as CDs and DVDs, it is required for music data to be expressed with a sound level within the range from −1 (0x7FFF as data) to +1 (0x8000 as data) in the fixed decimal mode of 16 bits, with a constant value +1 or −1 for the sound level out of the range. If a large sound continues beyond a recordable sound level during recording in storage media such as CDs and DVDs, a phenomenon called clipping occurs, that is vowel breaking, sound distortion, much noise, etc. to sounds when reproduced.

It is known that a mixing engineer uses a limiter in sound mixing to make clipping unnoticeable. The sound mixing using a limiter, however, depends on the skill of a mixing engineer and hence an improvement is required from the technical point of view.

In order to meet such a requirement, a known correction method uses sampled data prestored with the number of pieces of consecutive scaled-out audio data (clipped audio data) and the degree of change in the sound level of audio data that precedes or follows the consecutive scaled-out audio data, in correction of audio data for making clipping unnoticeable.

The known correction method uses prestored sampled data in correction of audio data. Thus, it is not always the case that audio data are corrected so that the audio data match the tone of music to be reproduced. Therefore, listeners may feel that reproduced music is not realistic.

For the reason above, there is a demand for a technique to correct scaled-out audio data for making clipping unnoticeable so that corrected data match the tone of music to be reproduced.

SUMMARY OF THE INVENTION

A purpose of the present invention is to provide a an audio-signal correction apparatus, an audio-signal correction method and an audio-signal correction program for improving a clipped audio signal waveform.

The present invention provides an audio-signal correction apparatus comprising: a difference calculation and storage unit configured to receive sequential digital audio signals, to calculate a difference between each currently sampled digital audio signal and another digital audio signal sampled at one sampling period before each currently sampled digital audio signal, and to store differences for the sequential digital audio signals; a clip counter configured to count the number of digital audio signals consecutively clipped in the received sequential digital audio signals; a correction unit configured to retrieve a specific difference, from the difference calculation and storage unit, for a digital audio signal sampled at a specific number of sampling periods before each clipped digital audio signal, the specific number of sampling periods being determined based on the counted number of digital audio signals consecutively clipped, and to correct each clipped digital audio signal based on the specific difference.

Moreover, the present invention provides an audio-signal correction method comprising the steps of: receiving sequential digital audio signals, calculating a difference between each currently sampled digital audio signal and another digital audio signal sampled at one sampling period before each currently sampled digital audio signal, and storing differences for the sequential digital audio signals; counting the number of digital audio signals consecutively clipped in the received sequential digital audio signals; retrieving a specific difference, from the stored differences, for a digital audio signal sampled at a specific number of sampling periods before each clipped digital audio signal, the specific number of sampling periods being determined based on the counted number of digital audio signals consecutively clipped; and correcting each clipped digital audio signal based on the specific difference.

Furthermore, the present invention provides an audio-signal correction program stored in a non-transitory computer readable storage medium, comprising: a program code of receiving sequential digital audio signals, calculating a difference between each currently sampled digital audio signal and another digital audio signal sampled at one sampling period before each currently sampled digital audio signal, and storing differences for the sequential digital audio signals; a program code of counting the number of digital audio signals consecutively clipped in the received sequential digital audio signals; a program code of retrieving a specific difference, from the stored differences, for a digital audio signal sampled at a specific number of sampling periods before each clipped digital audio signal, the specific number of sampling periods being determined based on the counted number of digital audio signals consecutively clipped; and a program code of correcting each clipped digital audio signal based on the specific difference.

BRIEF DESCRIPTION OF DRAWINGS

FIG. 4 is a table listing input audio data, a difference x(t), a correction value Y(t), and output audio data, showing the change in audio data through audio signal correction according to the present invention;

DETAILED DESCRIPTION OF PREFERRED EMBODIMENTS

Embodiments of an audio-signal correction apparatus, an audio-signal correction method, and an audio-signal correction program according the present invention will be explained with reference to the attached drawings. The same or analogous elements are given the same reference signs or numerals through the drawings with duplicated description thereof omitted.

Figure 1:
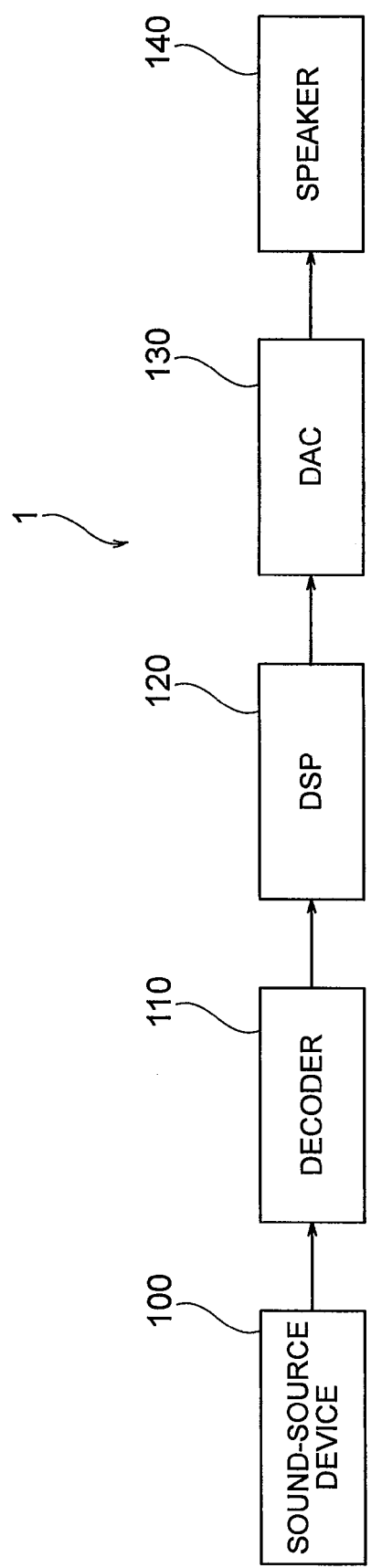
FIG. 1 is a block diagram schematically showing the configuration of an audio reproduction apparatus according to the present invention.

Described first with respect to FIG. 1 is an audio reproduction apparatus 1 having a clipped-waveform improving function (an audio-signal correction function).

The audio reproduction apparatus 1 is provided with a sound-source device 100, a decoder 110, a DSP (Digital Signal Processor) 120, a DAC (Digital-to-Analog Converter) 130, and a speaker 140.

The sound-source device 100 includes a CD player, a DVD player, etc. The sound-source device 100 outputs digital audio signals in the left (L) and right (R) channels, respectively. Each of a plurality of pieces of data that compose a digital audio signal has a value in sound level within the range from −1 (0x7FFF as data) to +1 (0x8000 as data) in the fixed decimal mode of 16 bits.

The decoder 110 decodes the L- and R-channel digital audio signals sent from the sound-source device 100 and outputs the decoded signals to the DSP 120.

The DSP 120 is an arithmetic unit for digital signal Processing. The DSP 120 processes a digital audio signal composed of a plurality of pieces of data each having a value in sound level in the range from −1 (0x7FFF as data) or lower to +1 (0x8000 as data) or larger in the floating decimal point mode. In the embodiment, the DSP 120 performs a clipped-waveform improving process to improve a clipped waveform included in the L- and R-channel digital audio signals decoded by the decoder 110 and outputs the corrected (clipped-waveform improved) L- and R-channel digital audio signals to the DAC 130.

The DAC 130 converts the corrected L- and R-channel digital audio signals output from the DSP 120 into analog audio signals and outputs the analog audio signals to the speaker 140.

When the analog audio signals are input, the speaker 140 converts the analog audio signals into sounds and gives off the sounds.

Described next in detail is the functional configuration of the DSP 120, with respect to FIG. 2.

Figure 2:
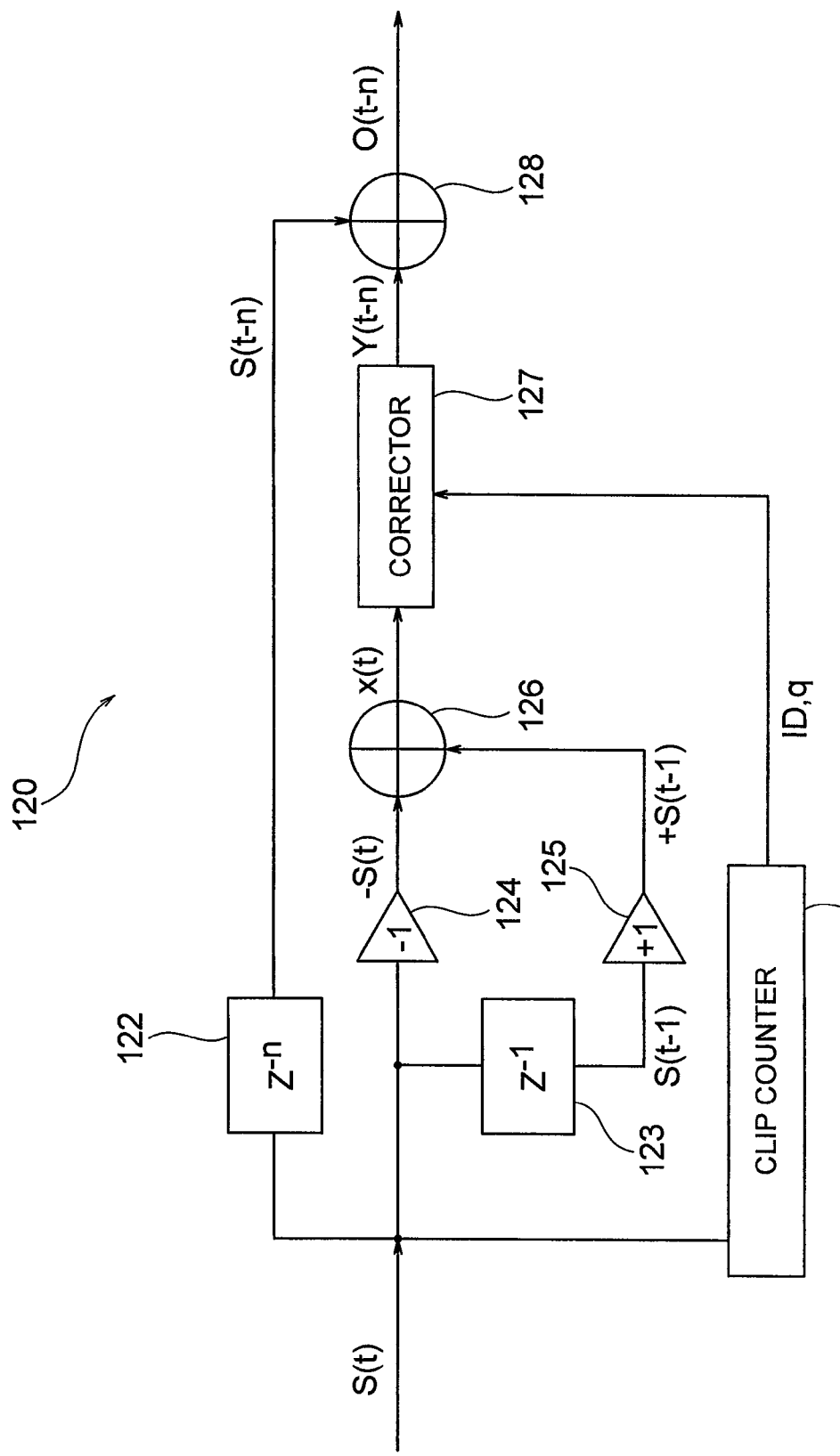
FIG. 2 is a block diagram showing an exemplary configuration of a digital signal processor installed in the audio reproduction apparatus of FIG. 1, as an embodiment of an audio-signal correction apparatus according to the present invention.

The DSP 120 is provided with a clipped-waveform improving circuit (an audio-signal correction circuit), as shown in FIG. 2, for each of L- and R-channel digital audio signals S input thereto.

The clipped-waveform improving circuit shown in FIG. 2 is to improve clipping of an input digital audio signal. The clipped-waveform improving circuit is provided with: a clip counter 121 for counting the number of pieces of data of a digital audio signal S while clipping is occurring; a delay element 122 for outputting data S(t−n) of the digital audio signal S sampled at n sampling periods before the current input data of the digital audio signal S; a delay element 123 for outputting data of the digital audio signal S sampled at one sampling period before the current input data; a buffer 124 for multiplying the current input data by −1; a buffer 125 for multiplying the output data of the delay element 123 by +1; an adder 126 for adding the output data of the buffers 124 and 125; a corrector 127 for generating and outputting a correction value Y(t−n) for the data S(t−n) output from the delay element 122; and an adder 128 for adding the data S(t−n) output from the delay element 122 and the correction value Y(t−n) output from the corrector 127 and outputting data O(t−n).

Each component of the clipped-waveform improving circuit shown in FIG. 2 will be described in detail.

In the following description, S(t), S(t−1), S(t−n) and S(t+m) denote a plurality of pieces of data that compose a digital audio signal S. In detail, S(t) denotes input data at a timing t, S(t−1) denotes data sampled at n sampling periods before the data S(t), and S(t+m) denotes data sampled at m sampling periods after the data S(t).

The clip counter 121 determines whether clipping is occurring in a digital audio signal S and if so, counts the number of pieces of clipped data. As defined above, input data has a value in sound level within the range from −1 to +1, in this embodiment. Thus, the clip counter 121 determines there are pieces of clipped data if a plurality of pieces of data each having the value +1 or −1 appear consecutively and counts a number q of consecutive same values +1 or −1 (the number q corresponding to the number of pieces of consecutive data having the same value +1 or −1). Then, the clip counter 121 informs the corrector 127 of identification information ID (for example, data-input timing information t) of data determined as clipped and a final count number q.

Suppose that a digital audio signal S is varying with data { . . . , S(i)=+0.7, S(i+1)=+0.8, S(i+2)=+1, S(i+3)=+1, S(i+4)=0.9, . . . }. The expression S(i)=+0.7 indicates that data S(i) has the value +1 in sound level. In this case, the value +1 continues for two pieces of consecutive data S(i+2) and S(i+3). Then, the clip counter 121 determines the occurrence of clipping when it detects the data S(i+3) and counts two as the final count number q. Then, the clip counter 121 informs the corrector 127 of the ID (t=i+2, q=2) and (t=i+3, q=2), for example.

It is further supposed that a digital audio signal S is varying with data { . . . , S(j)=−0.9, S(j+1)=−0.9, S(j+2)=−1, S(j+3)=−1, S(j+4)=−1, S(j+5)=+0.8, . . . }. In this case, the value −1 continues for three pieces of consecutive data S(j+2), S(j+3) and S(j+4). Then, the clip counter 121 determines the occurrence of clipping when it detects the data S(j+3) and counts three as the final number q. Then, the clip counter 121 informs the corrector 127 of the ID (t=j+2, q=3), (t=j+3, q=3) and (t=j+4, q=3), for example.

The delay element 122 samples input data S(t) at the timing t and outputs data S(t−n) sampled at n sampling periods before the data S(t). The letter n indicates a natural number larger than the maximum value of an expected number of times of continuous occurrence of clipping. The delay element 123 samples the input data S(t) at the timing t and outputs data S(t−1) sampled at one sampling period before the data S(t).

The buffer 124 multiplies the input data S(t) by −1 and outputs data −S(t). The buffer 125 multiplies the output data S(t−1) of the delay element 123 by +1 and outputs data +S(t−1).

The adder 126 adds the output data −S(t) of the buffer 124 and the outputs data +S(t−1) of the buffer 125 and outputs data {S(t−1)−S(t)}. This operation at the adder 126 corresponds to the acquisition of a difference x in sound level of the digital audio signal S for one sampling period.

The corrector 127 stores a difference x(t)={S(t−1)−S(t)}, the output of the adder 126, for each sampling period one after another. The delay element 123, the buffers 124 and 125, the adder 126, and the corrector 127 constitute a difference calculation and storage unit. The record of differences x(t) stored one after another is the record of the change in sound level. Moreover, the corrector 127 stores pairs of ID of data determined as clipped and the number q of consecutive same values (+1 or −1) sent from the clip counter 121 one after another.

In addition, the corrector 127 outputs the following value as a correction value Y(t−n):
(i) Y(t−n)=0, when the clip counter 121 determines that the data S(t−n) is not clipped;
(ii) Y(t−n)=x(t−n−q), when the clip counter 121 determines that the data S(t−n) is being clipped and the same value (+1 or −1) continues for q times (or for consecutive q pieces of input data).

The adder 128 adds the output data S(t−n) of the delay element 122 and the output data Y(t−n) of the corrector 127 to output data O(t−n) as the output data of the DSP 120. The corrector 127 (a correction value generator) and the adder 128 constitute a correction unit.

The operation of the audio reproduction apparatus 1 will be described next in detail.

The sound-source device 100 outputs L- and R-channel digital audio data to the decoder 110. The decoder 110 decodes the L- and R-channel digital audio data and inputs the decoded data to the DSP 120.

When L- or R-channel data S(t) is input to the DSP 120 at a timing t: the delay element 122 samples the data S(t) at the timing t and outputs data S(t−n) sampled at n sampling periods before the data S(t); the buffer 124 multiplies the data S(t) by −1 and outputs data −S(t); the delay element 123 samples the data S(t) at the timing t and outputs data S(t−1) sampled at one sampling period before the data S(t); and the buffer 125 multiplies the output data S(t−1) of the delay element 123 by +1 and outputs data +S(t−1).

The output data −S(t) of the buffer 124 and the output data +S(t−1) of the buffer 125 are added to each other by the adder 126 to be a difference x(t)=+S(t−1)−S(t). The difference x(t) is a difference between the data S(t) input at the timing t and the data S(t−1) sampled at one sampling period before the data S(t).

The difference x(t) is output from the adder 126 to the corrector 127 and stored therein, for each sampling period one after another, as the record of differences x(t) stored one after another. The number of the differences x(t) stored one after another is, for example, n that is a natural number larger than the maximum value of an expected number of times of continuous occurrence of clipping, as described above.

Moreover, when a plurality of pieces of L- or R-channel data S(t) are sequentially input to the DSP 120, the clip counter 121 determines whether each data S(t) has the value +1 or −1. When it is determined that each data S(t) has the value +1 or −1, the clip counter 121 starts counting of the number of the values +1 or −1 to determine the occurrence of clipping and halts the counting when determines the termination of clipping. In this way, the clip counter 121 counts the number q of the same values +1 or −1 of consecutive pieces of data of the digital audio signal S. Then, the clip counter 121 informs the corrector 127 of data ID (information identifying the timing t) of pieces of data determined as being clipped (for which the same values +1 or −1 continues) and the count number q (the number of pieces of consecutive digital audio data determined as being clipped).

The corrector 127 stores a pair of the data ID and the count number q informed by the clip counter 121. Based on the data ID and the count number q, the corrector 127 performs the following operations at the timing t:

Based on the data ID, the corrector 127 determines whether the data S(t−n) is being clipped by determining whether (t−n) has been stored as an ID of clipped data. If it is determined that the data S(t−n) is not clipped, the corrector 127 outputs a correction value Y(t−n)=0. On the other hand, if it is determined that the data S(t−n) is being clipped, the corrector 127 retrieves a difference x(t−n−q) from the record of differences x, as a correction value Y(t−n) and outputs the correction value Y(t−n)=x(t−n−q).

The correction value Y(t−n)=x(t−n−q) is output to the adder 128. Also output to the adder 128 is the data S(t−n) sampled at n sampling periods before the data S(t), from the delay element 122. The adder 128 adds the data S(t−n) and the correction value Y(t−n)=x(t−n−q) and outputs S(t−n)+Y(t−n) to the DAC 130 (FIG. 1), as the output data O(t−n) of the DSP 120.

The DAC 130 converts the output data O(t−n) of the DSP 120 into an analog signal and outputs it to the speaker 140 that gives off a sound.

Figure 3:
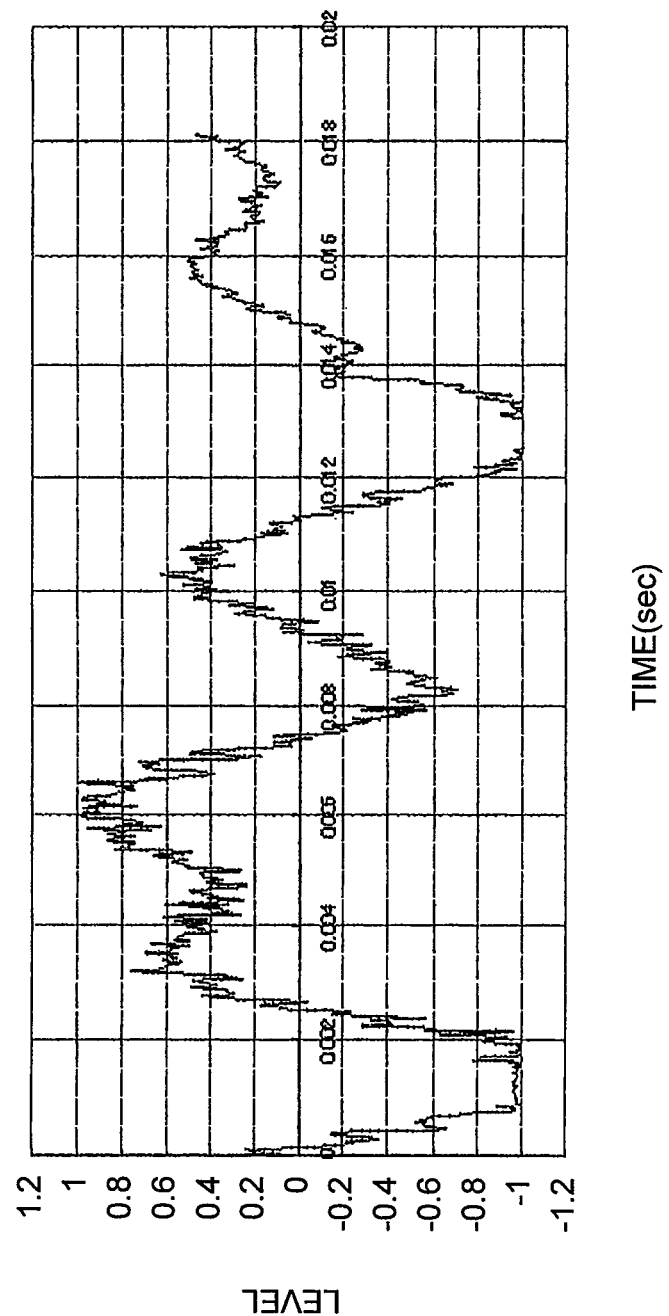
FIG. 3 shows an exemplary clipped waveform of an audio signal of music that is being played.
Figure 5:
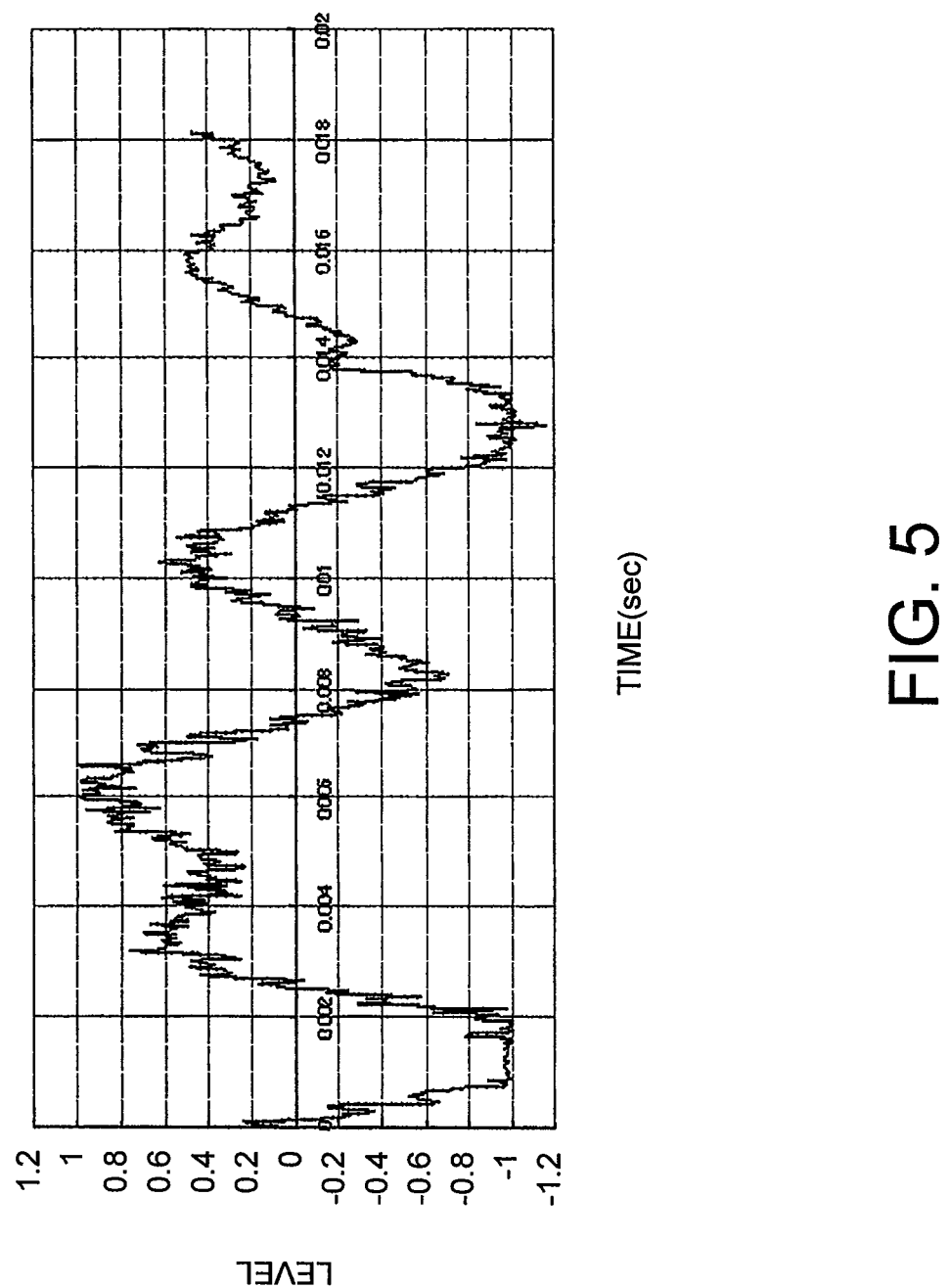
FIG. 5 shows an exemplary waveform of an audio signal subjected to the audio signal correction according to the present invention.

Described next with reference to FIGS. 3 to 5 is how the DSP 120 shown in FIG. 2 improves (or processes) a clipped waveform.

FIG. 3 shows an exemplary clipped waveform of an audio signal of music that is being played. It is illustrated in FIG. 3 that a sound level is continuously −1 around a period from the time 0.012 to 0.014 seconds, thus the waveform is being clipped.

FIG. 4 shows a table that lists: the timing t (data ID) of clipping that occurs during the time 0.012 to 0.014 seconds (FIG. 3); the number L of pieces of consecutive clipped data; data S(t) before being processed (pre-processed); a difference x(t) output from the adder 126; a correction value Y(t) output from the corrector 127; and data O(t) after being processed (post-processed) output from the adder 128, associated one another. It is understood from the table that clipping occurs for a certain number of pieces of data (covered by a sign "processed") that are pieces of data S(t), at the timing t=26~50, having the value −1 that continues for two or more of pieces of data. In this case, the count number q is 25 (t=26~50) for consecutive pieces of data.

A correction value Y(t)=0 is given to the pieces of data at the timing t=0~25 and 51~53 with no occurrence of clipping. A correction value Y(22)=0 is given to the data S(22) at the timing t=22, although the data S(22) has the value −1, due to no continuity of the value −1 before and after the data S(22).

On the other hand, a correction value Y(t)=x(t−q)=x(t−25) is given to the clipped pieces of data at the timing t=26~50, for example, Y(26)=x(26−25)=x(1)=−0.01691 at the timing t=26 and Y(50)=x(50−25)=x(25)=−0.0047 at the timing t=50. Accordingly, for clipped data S(t), a difference x for data that is q pieces of data before the clipped data S(t) is given as the correction value Y(t), as indicated by arrows in FIG. 4.

In FIG. 2, at the timing of supply of the data S(t−n) from the delay element 122 to the adder 128, the corrector 127 retrieves the corresponding correction value Y(t−n) and sends the correction value Y(t−n) to the adder 128. Then, the adder 128 adds the data S(t−n) and the corresponding correction value Y(t−n) to output data O(t−n) as the output data of the DSP 120.

The unclipped data S(0) to S(25) and S(51) to S(53) are output as output data O(0) to O(25) and O(51) to O(53) with no correction value added. For the clipped data S(26) at the timing t=26, a correction value Y(26)=x(26−25)=x(1)=0.01691 is added and then data O(26)=S(26)+Y(26)=−1−0.01691=−1.01691 is output. For the clipped data S(27) at the timing t=27, a correction value Y(27)=x(27−25)=x(2)=−0.01065 is added and then data O(27)=S(27)+Y(27)=−1−0.01065=−1.01065 is output. Moreover, for the clipped data S(50) at the timing t=50, a correction value Y(50)=x(50−25)=x(25)=−0.0047 is added and then data O(50)=S(50)+Y(50)=−1−0.0047=−1.0047 is output.

When an audio signal having a waveform of FIG. 3 is input to the DSP 120, data of the audio signal are processed as described above and then an audio signal having a waveform such as shown in FIG. 5 is output from the DAC 130. It is illustrated in FIG. 5 that the audio signal around the period from the time 0.012 to 0.014 seconds is corrected with the improvement in a clipped waveform.

As described above, according to the embodiment of the present invention, a clipped waveform of a digital audio signal is improved by using the digital audio signal itself so that clipping is not noticeable. Music has a tendency of cyclic repetition of a same waveform due to sound reflection. In this embodiment, clipping is improved under consideration of this tendency in correction of an audio signal of music, to be matched with the tone of music with less noise, which could otherwise cause much noise if vowel breaking, sound distortion, etc. occurs.

In the embodiment, the difference x(t) is defined as x(t)=S(t−1)−S(t). However, the difference x(t) may be defined as x(t)=S(t)−S(t−1), x(t)=S(t+1)−S(t) or x(t)=S(t)−S(t+1). Moreover, the output data O(t) is defined as O(t)=S(t)+Y(t). However, the output data O(t) may be defined as O(t)=S(t)−Y(t), O(t)=S(t)+k·Y(t) or O(t)=S(t)−k·Y(t). The letter k indicates a constant except for zero, which may however be a function, for example, a function of time.

The DSP 120 processes a digital audio signal composed of pieces of data each having a value in sound level in the range from −1 (0x7FFF as data) or lower to +1 (0x8000 as data) or larger in the floating decimal point mode, in the embodiment described above.

If a fixed-decimal point mode DSP is used for such a process, it cannot process a digital audio signal out of the range from −1 to +1. In order to process a digital audio signal out of the range from −1 to +1, a DSP 120a capable of processing fixed-point 24 bits can be used, although fixed-point bit number representation out of the range from −1 to +1 impossible.

Figure 6:
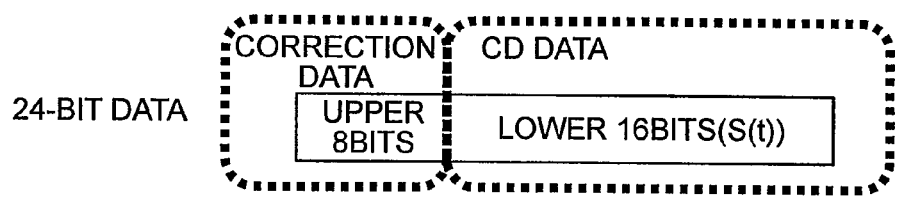
FIG. 6 shows an exemplary data format of audio data.

In detail, as shown in FIG. 6, for a such DSP 120a for fixed-point 24-bit processing, 16-bit audio data S(t) sent from the decoder 110 (FIG. 1) are stored in lower 16 bits of 24 bits to be processed and values (correction data) corresponding to zero are inserted in upper 8 bits of the 24 bits, for example. Suppose that input data is S(t)=0x8000 (1111000000000000). In this case, 0x00 is inserted in the upper 8 bits of the input data to convert the input data into 24-bit input data S(t)=0x008000 (000000001111000000000000). The 24-bit input data S(t) is then input to the fixed-point 24-bit DSP 120a that determines the occurrence of clipping if input data (t)=0x008000 or (t)=0x007FFF continues.

The output of a result of the fixed-point 24-bit processing described above may however give extremely small output data O(t). In order to avoid extremely small output data O(t), data O(t) already subjected to the fixed-point 24-bit processing may be shifted by 7 bits to the MSB (Most significant Bit) side, before being output.

Figure 7:
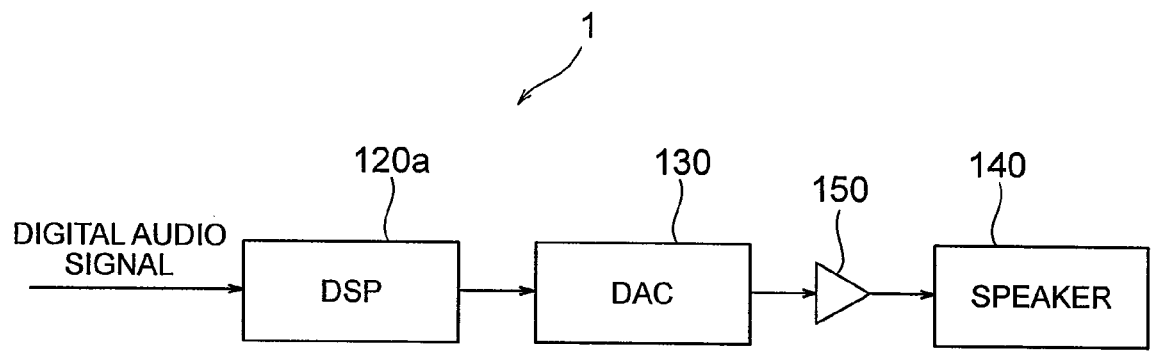
FIG. 7 is a block diagram schematically showing a variation to the audio reproduction apparatus according to the present invention.

Moreover, when the fixed-point 24-bit DSP 120a is used, as shown in FIG. 7, a buffer 150 may be provided between the DAC 130 and the speaker 140 (FIG. 1). In FIG. 7, when the output of the DSP 120a is converted into an analog signal by the DAC 130, the analog signal is subjected to 8-bit correction (amplification) at the buffer 150 and then output to the speaker 140.

Figure 8:
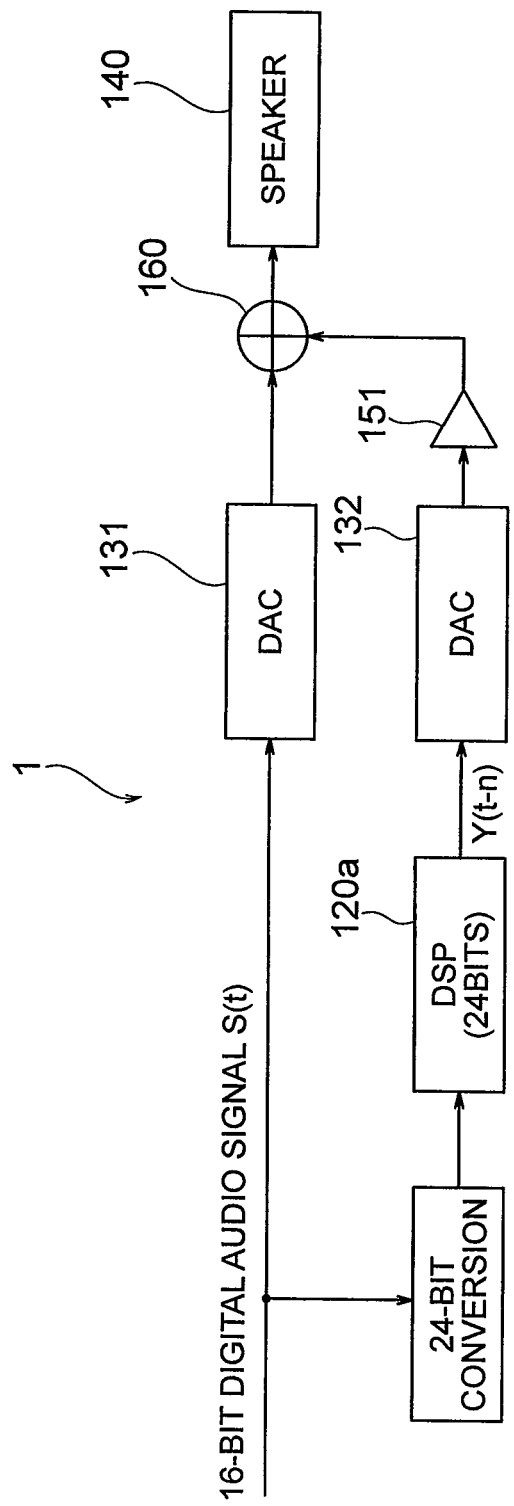
FIG. 8 is a block diagram schematically showing a variation to the audio reproduction apparatus according to the present invention.

Furthermore, when the fixed-point 24-bit DSP 120a is used, as shown in FIG. 8, DACs 131 and 132, a buffer 151, and an adder 160 may be provided between the DSP 120a and the speaker 140 (FIG. 1). In this case, 16-bit digital audio data S(t) output from the decoder 110 (FIG. 1) is sent to the DAC 131 (a first converter) as it is and also sent to the DSP 120a after 24-bit conversion. The DSP 120a processes 24-bit digital audio data S(t) and outputs a 24-bit correction value Y(t) to the DAC 132 (a second converter). An analog signal that corresponds to the 24-bit correction value Y(t) is then output from the DAC 132 to the buffer 151 (an amplifier) and amplified by an amplification factor corresponding to 8 bits to have a level corresponding to a 16-bit correction value Y(t). An analog output signal of the DAC 131 that corresponds to the 16-bit digital audio data S(t) and an analog output signal of the buffer 151 having the level corresponding to the 16-bit correction value Y(t) are added by the adder 160 and then output to the speaker 140.

Returning to the embodiment, the correction (improvement) is made with addition to clipped input data S(t) of a difference x(t−q) for data q pieces before the data S(t) when clipping occurs q times consecutively, as described above. Moreover, not only the difference x(t−q), what is added to the data S(t) may be a difference x between first data of a specific number of sampling clocks before the data S(t) and second data of one sampling clock before the first data (the specific number being determined based on the number q), during the occurrence of clipping. For example, a difference x(t−q−d) may be added to the clipped data S(t), where d is any natural number. These variation also make clipping unnoticeable.

Figure 9:
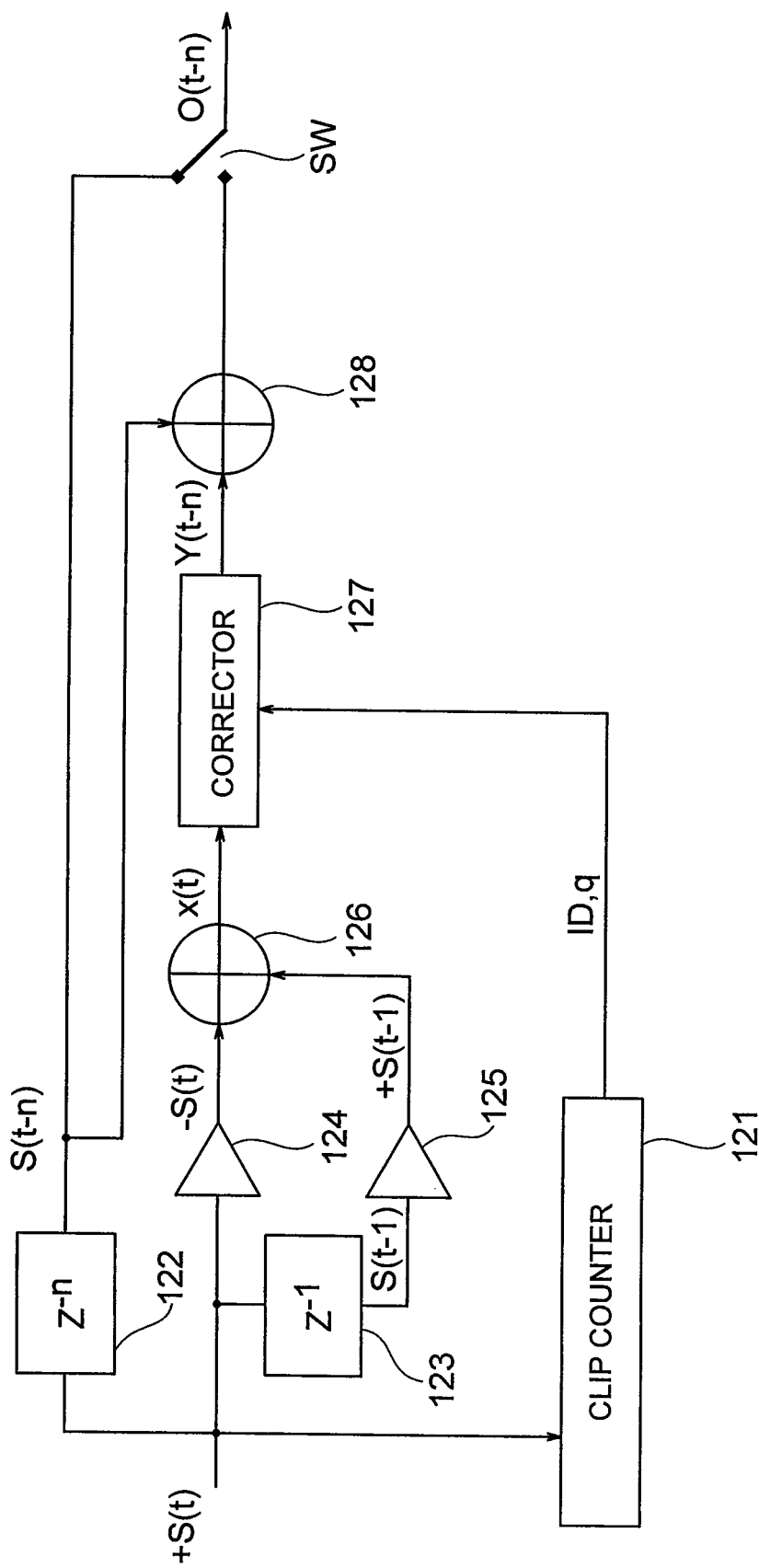
FIG. 9 is a block diagram schematically showing a variation to the embodiment of the digital signal processor.

Another variation is described. FIG. 9 shows a variation to the DSP 120 shown in FIG. 2. In FIG, a switch SW selects audio data S(t−n) if not clipped and outputs the data S(t−n) as output data O(t−n) whereas selects data S(t−n)+Y(t−n) output from the adder 128 if the data S(t−n) is clipped and outputs data S(t−n)+Y(t−n) as the output data O(t−n). The output data O(t−n) of the variation shown in FIG. 9 is identical with that of the DSP 120 shown in FIG. 2 when the same audio data S(t) is input to the variation and the DSP 120. One difference between the DSP 120 shown in FIG. 2 and the variation shown in FIG. 9 is that, when no clipping occurs, the correction value Y(t) is set to zero, that is Y(t)=0, in the DSP 120, whereas it can be set to any value in the variation.

Moreover, the DSP 120 for clipping improvement shown in FIG. 2 may be configured with a discrete circuit having a plurality of discrete components.

Furthermore, the DSP 120 (FIG. 2) or 120a (FIGS. 7 and 8) described above may be configured with a CPU that performs a clipped-waveform improving process which will be described with reference to FIG. 10.

When the clipped-waveform improving process starts, a value zero and a value one are substituted for a variable t that identifies input audio data S and a variable L that indicates the number of pieces of consecutive clipped audio data, respectively, in step S101. Then, t-th input audio data S(t) of a digital audio signal is acquired from the decoder 110 (FIG. 1) in step S102.

Next, a difference x(t)=S(t)−S(t−1) is calculated, in step S103, that is the difference between the current input audio data S(t) and audio data S(t−1) of the digital audio signal sampled at one sampling period before the current audio data S(t). The difference x(t) may be defined as x(t)=S(t−1)−S(t). Step S103 is skipped if the variable t is zero due to no existence of audio data S(t−1) at t=0, as shown in FIG. 4 with no difference x(t) obtained at t=0. Following to step S103, the variable t, the input audio data S(t), and the difference x(t) are stored as associated with one another, in step S104.

Next, it is determined whether the digital audio signal is being clipped, in step S105. In detail, it is determined, in step S105, whether the input audio data S(t) has a value +1 (0x8000 as data) or −1 (0x7FFF as data) and whether the value +1 or −1 appears consecutively (that is x(t)=0).

Suppose that the input audio data S(t) is determined as clipped (Yes in step S105), that is, it is determined that: the data S(t) has the value +1 or −1; and the value +1 or −1 appears consecutively, that is the difference x(t) between the data S(t) and the data S(t−1) sampled at one sampling period before the data S(t) is zero (x(t)=0). In this case, the value +1 is added to the variable L that indicates the number of pieces of consecutive clipped audio data, to update the variable L, in step S106, followed by step S111 which will be described later.

On the other hand, suppose that the input audio data S(t) is determined as not clipped (No in step S105), that is, if it is determined that: the data S(t) does not have the value +1 or −1; and the difference x(t) is not zero. In this case, it is determined, in step S107, whether clipping has occurred just before the data S(t) and the clipped state changes into a non-clipped state at the data S(t), or whether the clipped state is improved.

Suppose that the clipped state is improved (Yes in step S107), or it is determined that: the audio data S(t−1) sampled at one sampling period before the audio data S(t) has the value +1 or −1; and the value +1 or −1 appears consecutively (that is x(t−1)=0). In this case, the variable L that indicates the number of pieces of consecutive clipped audio data is substituted for the number q that indicates the number of pieces of consecutive clipped audio data, in step S108. The count number of the variable L is initialized to be one for succeeding counting, in step S109. Then, the number q and the variable t that identifies input data S from the occurrence to cease of clipping are stored as associated with each other, in step S110, followed by step S111 which will be described later. On the other hand, if the clipped state is not improved (No in step S107), the process jumps to step S111.

In step S111, it is determined whether the variable t (the data identifier) that identifies input data S is larger than or equal to the number n that is a natural number larger than the maximum value of an expected number of times of continuous occurrence of clipping (t≥n) to determine whether there is audio data to be output. As described above, step S111 is performed: if the value +1 is given to the variable L that indicates the number of pieces of consecutive clipped audio data (updating of the count number L) in step S106; if the number q and the data identifier t are stored in step S110; or if the clipped state is determined as not improved (No in step S107).

Suppose that it is determined as No in step S111 that the variable t is smaller than the number n (t<n) which means there is no data to be output. In this case, the value +1 is added to the variable t to update the variable t in step S112 and the process returns to step S102.

On the other hand, suppose that it is determined as Yes in step S111 that the variable t is larger than or equal to the number n (t≥n) which means there is data to be output. In this case, it is determined, in step S113, whether (t−n)-th audio data S(t−n) to be output has been clipped, by using the data identifier t and the number q stored in step S110.

If it is determined that (t−n)-th audio data has been clipped (Yes in step S113), the audio data S(t−n) is added with the difference (t−n−q) for the audio data that is q pieces of data before the data S(t−n) so that the data S(t−n) is corrected for improving its clipped waveform, in step S114.

On the other hand, if it is determined that (t−n)-th audio data has not been clipped (No in step S113), step S114 is skipped due to no necessity of clipped waveform improvement.

Then, in step S115, the audio data S(t−n) is output to the DAC 130 (FIG. 1), followed by step S112 to add the value +1 to the variable t and the process returns to step S102, to repeat the step S102 and the following steps for the succeeding audio data.

The clipped-waveform improving process of FIG. 9 will be described further with respect to FIG. 4, with the supposition that the input of audio data starts at t=1.

For audio data at the timing t=1 to t=26 (the data identifier), it is determined No in steps S105 and S107. On the other hand, for audio data at the timing t=27, it is determined as S(t)=−1 and x(t)=0 in step S105, the value +1 is added to the variable L=1 to give L=2 in step S106, and then the variable t is updated in step S112 via steps S111 to S115. The steps for the audio data at t=27 are repeated up to t=50, with continuous updating of the variable L (L=25) in step S106.

Then, for audio data at the timing t=51, it is determined No in step S105 but Yes in step S107 (the clipped state is improved). Therefore, the variable L=25 (due to the continuous updating of the variable L in step S106) is substituted for the number q that indicates the number of pieces of consecutive clipped audio data, in step S108, followed by the initialization of the variable L, in step S109. Then, the data identifiers (t−q~t−1) while clipping occurs, that are t=26 to t=50, and the number q=25 that indicates the number of pieces of consecutive clipped audio data are stored as associated with each other, in step S110.

For audio data at each timing (t−n)=1 to 25 in FIG. 4, it is determined that input audio data S(S−n) is not clipped (No in step S113). Thus, the data S(S−n) is output as it is, in step S115.

Then, for audio data at the timing (t−n)=26, it is determined that input audio data S(S−n) is clipped (Yes in step S113) based on the data identifiers (t=26 to t=50) and the number q=25. The difference x((t−n)−q)=x(26−25)=x(1) is retrieved and added to S(26)=−1 in step S114, thereby corrected data S(26)=−1−0.01691=−1.0691 is output in step S115.

The steps for the audio data at the timing (t−n)=26 are repeated up to the timing (t−n)=50, thereby corrected data S(27) to S(50) are output sequentially.

As described above, according to the audio-signal correction method of the present invention, a clipped waveform of a digital audio signal is improved by using the audio signal itself, thus correction matched with the tone of music to be produced is achieved with substantially no vowel breaking, no sound distortion, no noises, etc. to sounds when reproduced.

It is further understood by those skilled in the art that the foregoing description is a preferred embodiment of the disclosed device or method and that various changes and modifications may be made in the invention without departing from the sprit and scope thereof.

Figure 10:
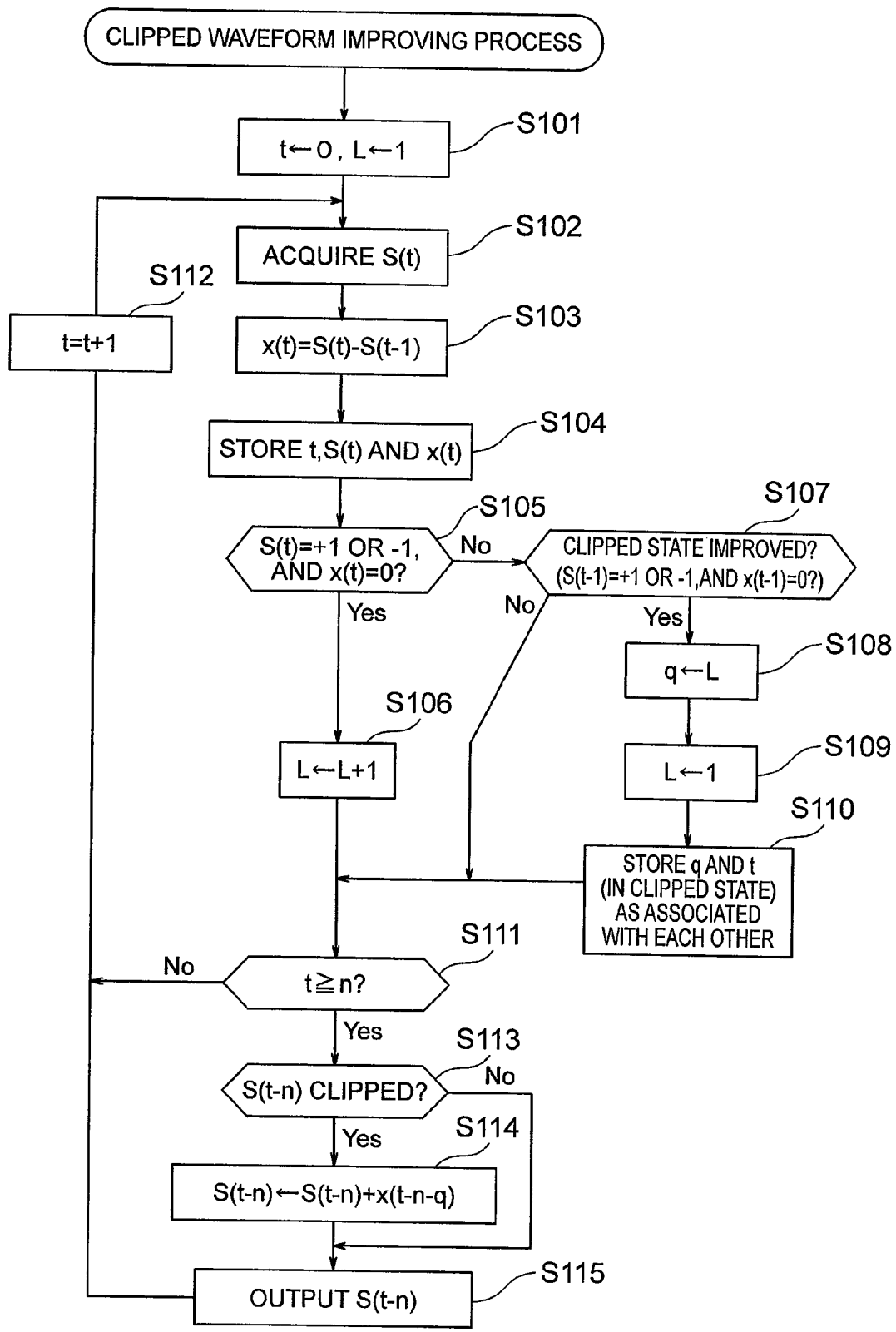
FIG. 10 is a flow chart explaining an embodiment of an audio-signal correction method according to the present invention.

Moreover, a program running on a computer to achieve the clipped-waveform improving process shown in FIG. 10 may be retrieved from a non-transitory computer readable storage medium or transferred over a network and installed in a computer.

As described above in detail, according to the present invention, a clipped waveform of a digital audio signal is improved by using the audio signal itself, thus correction matched with the tone of music to be produced is achieved in addition to make clipping unnoticeable.

What is claimed is:

1. An audio-signal correction apparatus comprising:
   a difference calculation and storage unit configured to receive sequential digital audio signals, to calculate a difference between each currently sampled digital audio signal and another digital audio signal sampled at one sampling period before each currently sampled digital audio signal, and to store differences for the sequential digital audio signals;
   a clip counter configured to count the number of digital audio signals consecutively clipped in the received sequential digital audio signals;
   a correction unit configured to retrieve a specific difference, from the difference calculation and storage unit, for a digital audio signal sampled at a specific number of sampling periods before each clipped digital audio signal, the specific number of sampling periods being determined based on the counted number of digital audio signals consecutively clipped, and to correct each clipped digital audio signal based on the specific difference;
   a first converter configured to convert each of the received sequential digital audio signals into a first analog signal;
   a second converter configured to convert the corrected digital audio signal into a second analog signal;
   an amplifier configured to amplify the second analog signal; and
   an adder configured to add the first analog signal and the amplified second analog signal;
   wherein each of the received sequential digital audio signals is composed of a first specific number of bits wherein the correction unit shifts the first specific number of bits to lower bits of a second specific number of bits larger than the first specific number of bits, and processes the second specific number of bits having the shifted first specific number of bits in correction of each clipped digital audio signal.

2. The audio-signal correction apparatus according to claim 1 wherein the correction unit includes:
   a correction value generator configured to generate a correction value based on the specific difference retrieved from the difference calculation and storage unit; and
   an adder configured to add the correction value to each clipped digital audio signal to output a corrected audio signal.

3. The audio-signal correction apparatus according to claim 1 wherein the clip counter determines that the digital audio signals are consecutively clipped if the digital audio signals have a same value in sound level consecutively.

4. An audio-signal correction method comprising the steps of:
   receiving sequential digital audio signals each composed of a first specific number of bits, calculating a difference between each currently sampled digital audio signal and another digital audio signal sampled at one sampling period before each currently sampled digital audio signal, and storing differences for the sequential digital audio signals;
   counting the number of digital audio signals consecutively clipped in the received sequential digital audio signals;
   retrieving a specific difference, from the stored differences, for a digital audio signal sampled at a specific number of sampling periods before each clipped digital audio signal, the specific number of sampling periods being determined based on the counted number of digital audio signals consecutively clipped;
   correcting each clipped digital audio signal based on the specific difference;
   converting each of the received sequential digital audio signals into a first analog signal;
   converting the corrected digital audio signal into a second analog signal;
   amplifying the second analog signal;
   adding the first analog signal and the amplified second analog signal;
   shifting the first specific number of bits to lower bits of a second specific number of bits larger than the first specific number of bits; and
   processing the second specific number of bits having the shifted first specific number of bits in correction of each clipped digital audio signal.

5. The audio-signal correction method according to claim 4, further comprising the steps of:
   generating a correction value based on the specific difference retrieved from the stored differences; and
   adding the correction value to each clipped digital audio signal to output a corrected audio signal.

6. The audio-signal correction method according to claim 4 further comprising the step of determining that the digital audio signals are consecutively clipped if the digital audio signals have a same value in sound level consecutively.

7. A non-transitory computer readable storage medium, storing an audio-signal correction program which, when executed by a computer processor, performs the steps of:
   a program code of receiving sequential digital audio signals composed of a first specific number of bits, calculating a difference between each currently sampled digital audio signal and another digital audio signal sampled at one sampling period before each currently sampled digital audio signal, and storing differences for the sequential digital audio signals;
   a program code of counting the number of digital audio signals consecutively clipped in the received sequential digital audio signals;
   a program code of retrieving a specific difference, from the stored differences, for a digital audio signal sampled at a specific number of sampling periods before each clipped digital audio signal, the specific number of sampling periods being determined based on the counted number of digital audio signals consecutively clipped;
   a program code of correcting each clipped digital audio signal based on the specific difference;
   a program code of converting each of the received sequential digital audio signals into a first analog signal;
   a program code of converting the corrected digital audio signal into a second analog signal;
   a program code of amplifying the second analog signal; and
   a program code of adding the first analog signal and the amplified second analog signal;

a program code of shifting the first specific number of bits to lower bits of a second specific number of bits larger than the first specific number of bits; and a program code of processing the second specific number of bits having the shifted first specific number of bits in correction of each clipped digital audio signal.

8. The audio-signal correction program according to claim 7, further comprising:

a program code of generating a correction value based on the specific difference retrieved from the stored differences; and a program code of adding the correction value to each clipped digital audio signal to output a corrected audio signal.

9. The audio-signal correction program according to claim 7 further comprising a program code of determining that the digital audio signals are consecutively clipped if the digital audio signals have a same value in sound level consecutively.

* * * * *